(12) United States Patent
Liu et al.

(10) Patent No.: US 10,236,276 B2
(45) Date of Patent: Mar. 19, 2019

(54) SEMICONDUCTOR DEVICE INCLUDING VERTICALLY INTEGRATED GROUPS OF SEMICONDUCTOR PACKAGES

(71) Applicant: SANDISK INFORMATION TECHNOLOGY (SHANGHAI) CO., LTD., Shanghai (CN)

(72) Inventors: Yangming Liu, Shanghai (CN); Chin-Tien Chiu, Taichung (TW); Zhongli Ji, Shanghai (CN); Shaopeng Dong, Shanghai (CN); Zengyu Zhou, Shanghai (CN)

(73) Assignee: SanDisk Information Technology (Shanghai) Co., Ltd., Shanghai (CN)

(*) Notice: Subject to any disclaimer, the term of this patent is extended or adjusted under 35 U.S.C. 154(b) by 0 days.

(21) Appl. No.: 15/620,471

(22) Filed: Jun. 12, 2017

(65) Prior Publication Data
US 2018/0294251 A1    Oct. 11, 2018

(30) Foreign Application Priority Data

Apr. 7, 2017    (CN) .......................... 2017 1 0224640

(51) Int. Cl.
*H01L 25/10*    (2006.01)
*H01L 25/04*    (2014.01)
(Continued)

(52) U.S. Cl.
CPC ........ *H01L 25/0657* (2013.01); *H01L 25/105* (2013.01); *H01L 25/50* (2013.01); *H01L 25/043* (2013.01); *H01L 25/0652* (2013.01); *H01L 25/071* (2013.01); *H01L 25/074* (2013.01); *H01L 25/0756* (2013.01); *H01L 25/117* (2013.01); *H01L 2224/16145* (2013.01); *H01L 2224/32145* (2013.01); *H01L 2224/48145* (2013.01); *H01L 2225/06506* (2013.01); *H01L 2225/06555* (2013.01); *H01L 2225/06562* (2013.01); *H01L 2225/06586* (2013.01);
(Continued)

(58) Field of Classification Search
CPC ... H01L 25/0657; H01L 25/105; H01L 25/50; H01L 2224/16145; H01L 2224/32145; H01L 2224/48145; H01L 2225/06555; H01L 25/043; H01L 25/074; H01L 25/0756; H01L 25/117; H01L 25/0652; H01L 25/071
See application file for complete search history.

(56) References Cited

U.S. PATENT DOCUMENTS 6,150,724 A    11/2000  Wenzel et al.
7,750,455 B2 *  7/2010  Pagaila ............... H01L 25/0657
                                                257/686
(Continued)

OTHER PUBLICATIONS

U.S. Appl. No. 15/619,812, filed Jun. 12, 2017.
(Continued)

*Primary Examiner* — Ida M Soward
(74) *Attorney, Agent, or Firm* — Vierra Magen Marcus LLP

(57) ABSTRACT

A semiconductor device is disclosed including at least first and second vertically stacked and interconnected groups of semiconductor packages. The first and second groups of semiconductor packages may differ from each other in the number of packages and functionality.

17 Claims, 9 Drawing Sheets

(51) Int. Cl.
*H01L 25/07* (2006.01)
*H01L 25/11* (2006.01)
*H01L 25/065* (2006.01)
*H01L 25/00* (2006.01)
H01L 25/075 (2006.01)

(52) U.S. Cl.
CPC ............... *H01L 2225/1041* (2013.01); *H01L 2225/1058* (2013.01)

(56) References Cited

U.S. PATENT DOCUMENTS

| | | | |
|---|---|---|---|
| 8,125,092 B2 | 2/2012 | Corisis et al. | |
| 8,232,631 B2 | 7/2012 | Cho | |
| 8,253,232 B2 * | 8/2012 | Kim | H01L 23/3128 257/686 |
| 8,436,455 B2 | 5/2013 | Eun | |
| 8,525,349 B2 | 9/2013 | Song et al. | |
| 8,823,180 B2 * | 9/2014 | Wang | H01L 25/105 257/737 |
| 9,184,128 B2 | 11/2015 | Hung et al. | |
| 2007/0001277 A1 | 1/2007 | Ichikawa | |
| 2007/0141750 A1 | 6/2007 | Iwasaki et al. | |
| 2007/0235850 A1 | 10/2007 | Gerber et al. | |
| 2008/0105984 A1 * | 5/2008 | Lee | H01L 23/3128 257/777 |
| 2009/0166846 A1 | 7/2009 | Pratt et al. | |
| 2009/0309206 A1 | 12/2009 | Kim et al. | |
| 2010/0072593 A1 | 3/2010 | Kim et al. | |
| 2010/0171206 A1 * | 7/2010 | Chu | H01L 21/565 257/686 |
| 2010/0193930 A1 * | 8/2010 | Lee | H01L 23/49816 257/686 |
| 2010/0283140 A1 | 11/2010 | Kim et al. | |
| 2011/0127679 A1 * | 6/2011 | Eun | H01L 23/481 257/774 |
| 2011/0133324 A1 | 6/2011 | Fan et al. | |
| 2011/0244634 A1 | 10/2011 | Kim et al. | |
| 2012/0025398 A1 * | 2/2012 | Jang | H01L 21/565 257/777 |
| 2012/0091597 A1 | 4/2012 | Kwon et al. | |
| 2012/0217642 A1 * | 8/2012 | Sun | H01L 25/16 257/773 |
| 2013/0062784 A1 | 3/2013 | Hong | |
| 2014/0264858 A1 * | 9/2014 | Chen | H01L 24/14 257/738 |
| 2016/0093590 A1 | 3/2016 | Chen et al. | |
| 2016/0111409 A1 * | 4/2016 | Yew | H01L 23/481 438/107 |
| 2016/0141227 A1 * | 5/2016 | Lin | H01L 25/0657 257/774 |
| 2016/0334845 A1 * | 11/2016 | Mittal | H01L 23/34 |
| 2016/0343649 A1 * | 11/2016 | Chen | H01L 23/3128 |
| 2017/0033084 A1 * | 2/2017 | Chang | H01L 25/0657 |
| 2017/0278821 A1 * | 9/2017 | Zhao | H01L 24/45 |
| 2017/0294410 A1 * | 10/2017 | Haba | H01L 25/0657 |
| 2017/0373039 A1 * | 12/2017 | Hsu | H01L 21/78 |

OTHER PUBLICATIONS

Office Action dated Mar. 29, 2018 in U.S. Appl. No. 15/619,812, 18 pages.
Restriction Requirement dated Dec. 11, 2017 in U.S. Appl. No. 15/619,812.
Response to Restriction Requirement filed Feb. 9, 2018 in U.S. Appl. No. 15/619,812.
Office Action dated Apr. 12, 2018, and English Summary Translation, in Korean Patent Application No. 10-2017-0079029.
Response to Office Action filed Jun. 29, 2018 in U.S. Appl. No. 15/619,812, 12 pages.
Response to Office Action filed Jul. 12, 2018 in Korean Patent Application No. 10-2017-0079029, 42 pages.
Office Action dated Oct. 15, 2018 in U.S. Appl. No. 15/619,812, 31 pages.
Office Action dated Oct. 23, 2018 in Korean Patent Application No. 10-2017-0079029, 7 pages.
Response to Office Action filed Dec. 11, 2018 in U.S. Appl. No. 15/619,812.
Response to Office Action filed Dec. 20, 2018 in Korean Patent Application No. 10-2017-0079029.

* cited by examiner

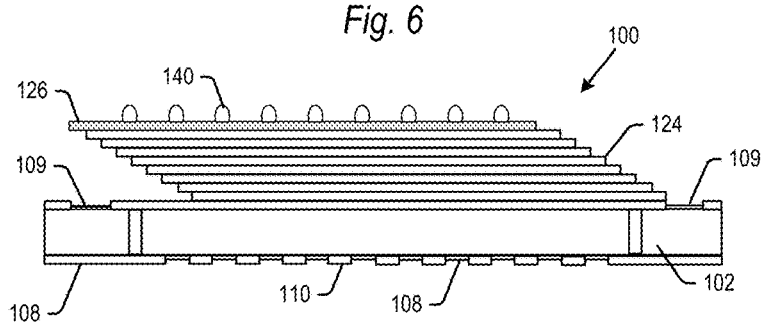
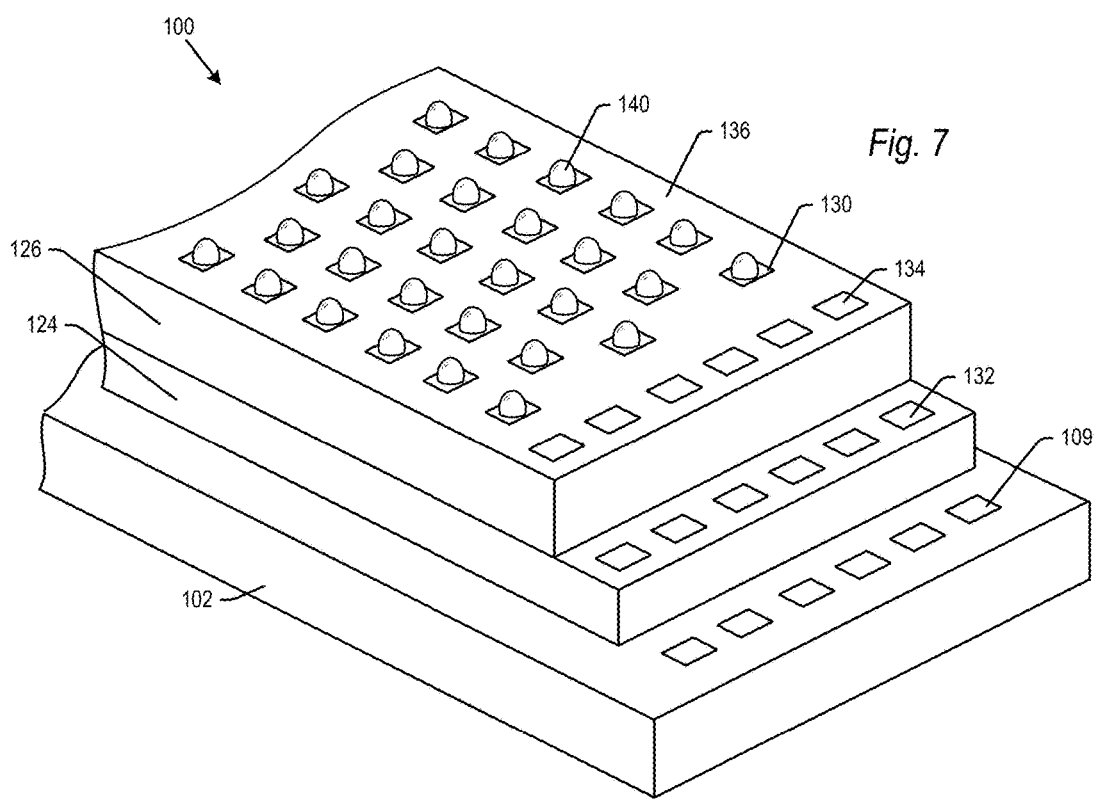

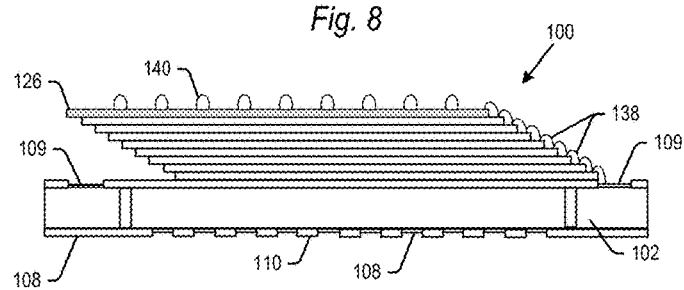
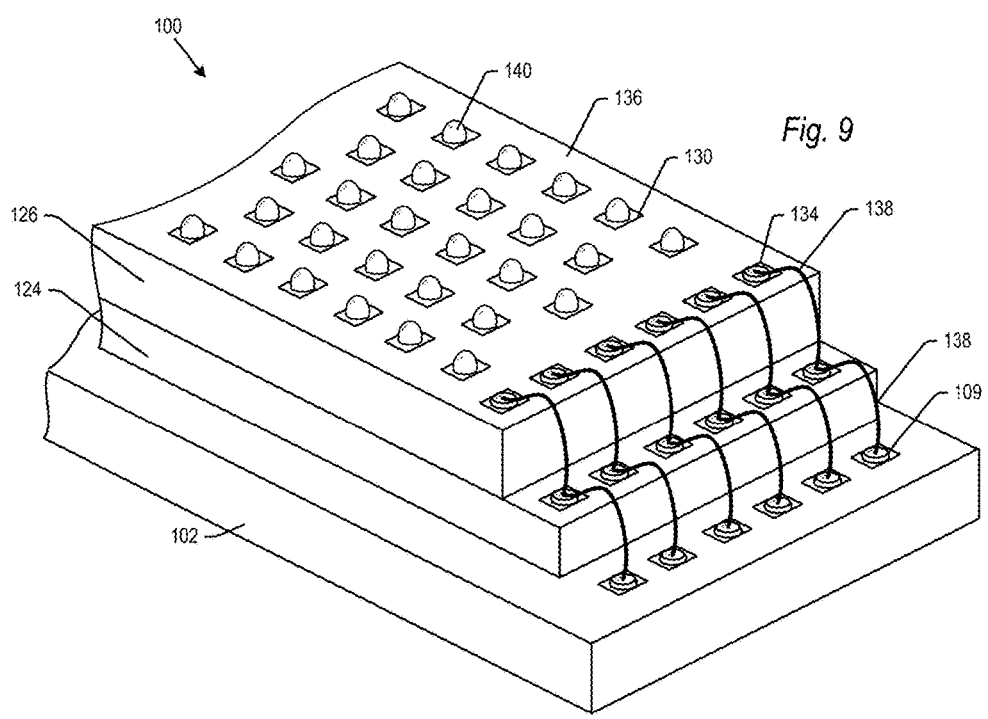

SEMICONDUCTOR DEVICE INCLUDING VERTICALLY INTEGRATED GROUPS OF SEMICONDUCTOR PACKAGES

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound which provides a protective package.

In order to most efficiently use package footprint, it is known to stack semiconductor die on top of each other. In order to provide access to bond pads on the semiconductor die, the die are stacked, either completely overlapping each other with a spacer layer in between adjacent die, or with an offset. In an offset configuration, a die is stacked on top of another die so that the bond pads of the lower die are left exposed.

As semiconductor die become thinner, and in order to increase memory capacity in semiconductor packages, the number of die stacked within a semiconductor package continues to increase. However, this can make for long bonds wire from the upper die down to the substrate. Long wire bonds are easily damaged or electrically shorted to other wire bonds, and also have higher signal to noise ratio than shorter bond wires. Moreover, larger numbers of semiconductor die in a package can adversely affect yields.

DESCRIPTION OF THE DRAWINGS

FIG. 6 is a side view of a semiconductor device at a fifth step in the fabrication process according to an embodiment of the present technology.

FIG. 7 is a simplified perspective view of a semiconductor device at the fifth step in the fabrication process according to an embodiment of the present technology.

FIG. 8 is a side view of a semiconductor device at a sixth step in the fabrication process according to an embodiment of the present technology.

FIG. 9 is a simplified perspective view of a semiconductor device at the sixth step in the fabrication process according to an embodiment of the present technology.

DETAILED DESCRIPTION

The present technology will now be described with reference to the figures, which in embodiments, relate to a semiconductor device including vertically stacked and interconnected groups of semiconductor packages. The first and second groups of semiconductor packages may differ from each other in the number of packages and functionality.

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal" as may be used herein are by way of example and illustrative purposes only, and are not meant to limit the description of the technology inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±0.25%.

An embodiment of the present technology will now be explained with reference to the flowchart of FIG. 1 and the top, side and perspective views of FIGS. 2 through 18. Although FIGS. 2 through 18 each show an individual semiconductor package 100 and/or 170, or a portion thereof, it is understood that the packages 100 and 170 may be batch processed along with a plurality of other packages on substrate panels to achieve economies of scale. The number of rows and columns of packages 100, 170 on the substrate panels may vary.

Figure 2:
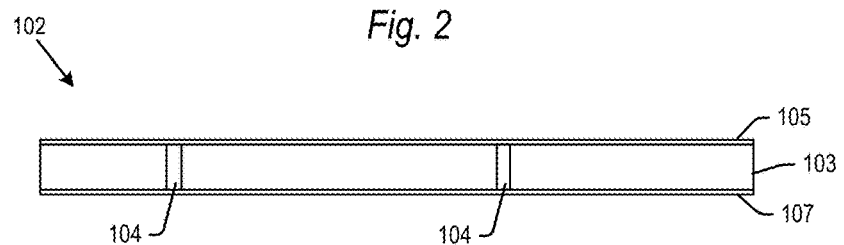
FIG. 2 is a side view of a semiconductor device at a first step in the fabrication process according to an embodiment of the present technology.

The substrate panel for the fabrication of semiconductor package 100 begins with a plurality of substrates 102 (again, one such substrate is shown in FIGS. 2 through 18). The substrate 102 may be a variety of different chip carrier mediums, including a printed circuit board (PCB), a leadframe or a tape automated bonded (TAB) tape. Where substrate 102 is a PCB, the substrate may be formed of a core 103 having a top conductive layer 105 and a bottom conductive layer 107 as shown in FIG. 2. The core 103 may be formed of various dielectric materials such as for example, polyimide laminates, epoxy resins including FR4 and FR5, bismaleimide triazine (BT), and the like. The core may have a thickness of between 40 microns (μm) to 200 μm, although the thickness of the core may vary outside of that range in alternative embodiments. The core 103 may be ceramic or organic in alternative embodiments.

The conductive layers 105, 107 surrounding the core may be formed of copper or copper alloys, plated copper or plated copper alloys, Alloy 42 (42Fe/58Ni), copper plated steel, or other metals and materials suitable for use on substrate panels. The conductive layers may have a thickness of about 10 μm to 25 μm although the thickness of the layers may vary outside of that range in alternative embodiments.

Figure 1:
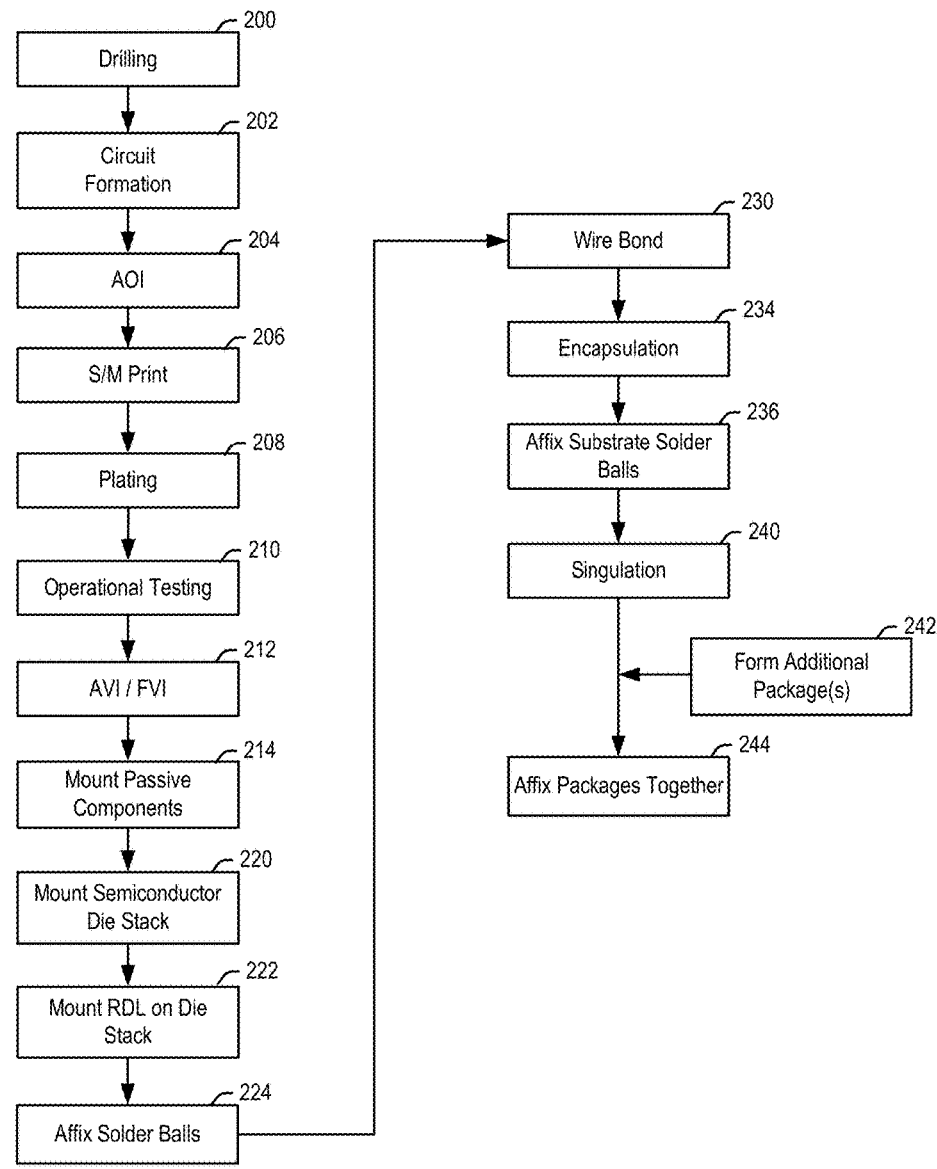
FIG. 1 is a flowchart of the overall fabrication process of semiconductor device according to embodiments of the present technology.
Figure 3:
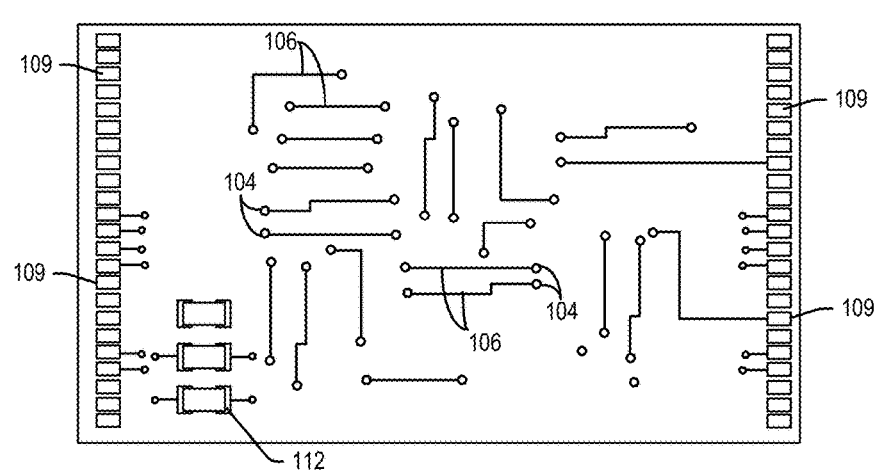
FIG. 3 is a top view of a semiconductor device at a second step in the fabrication process according to an embodiment of the present technology.
Figure 4:
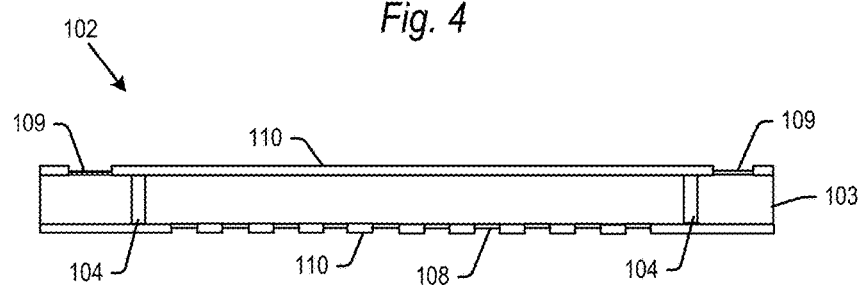
FIG. 4 is a side view of a semiconductor device at a third step in the fabrication process according to an embodiment of the present technology.

FIG. 1 is a flowchart of the fabrication process for forming a semiconductor device 180 according to embodiments of the present technology. In a step 200, the substrate 102 of a first semiconductor package 100 may be drilled to define through-hole vias 104 in the substrate 102. The vias 104 are by way of example, and the substrate 102 may include many more vias 104 than are shown in the figures, and they may be in different locations than are shown in the figures. Conductance patterns are next formed on one or both of the top and bottom conductive layers in step 202. The conductance pattern(s) may include electrical traces 106, contact pads 109 on a top surface of the substrate and contact pads 108 on a bottom surface of the substrate as shown for example in FIGS. 3 and 4. The traces 106 and contact pads 109, 108 (only some of which are numbered in the figures) are by way of example, and the substrate 102 may include more traces and/or contact pads than is shown in the figures, and they may be in different locations than is shown in the figures. In one embodiment, the substrate 102 may include one or more rows of contact pads 109 at opposed edges of the substrate 102 as shown in FIG. 3. Further embodiments may employ a multi-layer substrate, which include internal conductance patterns in addition to those on the top and/or bottom surfaces.

In various embodiments, the finished semiconductor device may be used as a BGA (ball grid array) package. A lower surface of the substrate 102 may include contact pads 108 for receiving solder balls as explained below. In various embodiments, the finished semiconductor device 180 may be an LGA (land grid array) package including contact fingers for removably coupling the finished device 180 within a host device. In such embodiments, the lower surface may include contact fingers instead of the contact pads that receive solder balls. The conductance pattern on the top and/or bottom surfaces of the substrate 102 may be formed by a variety of suitable processes, including for example various photolithographic processes.

Referring again to FIG. 1, the substrate 102 may next be inspected in step 204. This step may include an automatic optical inspection (AOI). Once inspected, a solder mask 110 (FIG. 4) may be applied to the substrate in step 206. After the solder mask is applied, the contact pads, and any other areas to be soldered on the conductance patterns may be plated, for example, with a Ni/Au, Alloy 42, or the like, in step 208 in a known electroplating or thin film deposition process. The substrate 102 may then undergo operational testing in step 210. In step 212, the substrate may be visually inspected, including for example an automated visual inspection (AVI) and a final visual inspection (FVI) to check for contamination, scratches and discoloration. One or more of these steps may be omitted or performed in a different order.

Assuming the substrate 102 passes inspection, passive components 112 (FIG. 3) may next be affixed to the substrate 102 in a step 214. The one or more passive components may include for example one or more capacitors, resistors and/or inductors, though other components are contemplated. The passive components 112 shown are by way of example only, and the number, type and position may vary in further embodiments.

Figure 5:
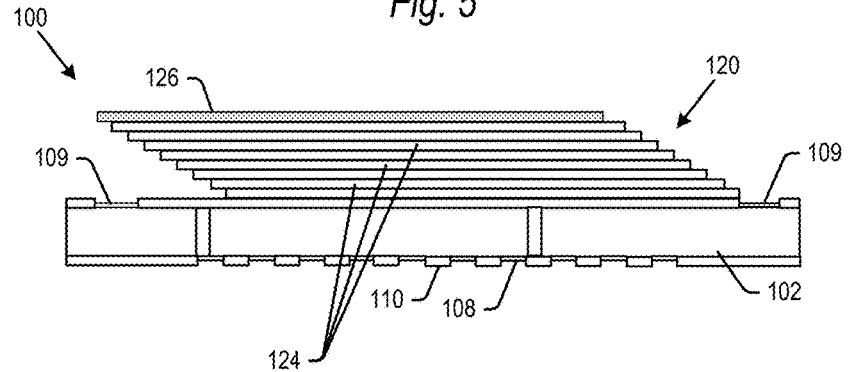
FIG. 5 is a side view of a semiconductor device at a fourth step in the fabrication process according to an embodiment of the present technology.

Referring to FIG. 5, a number of semiconductor die 124 may next be stacked on the substrate 102 in step 220. The semiconductor die 124 may for example be memory die such a NAND flash memory die, but other types of die 124 may be used. These other types of semiconductor die include but are not limited to controller die such as an ASIC, or RAM such as an SDRAM. The semiconductor die 124 may further alternatively be used to form package 100 into a power semiconductor device such as for example a switch or rectifier. Where multiple semiconductor die 124 are included, the semiconductor die 124 may be stacked atop each other in an offset stepped configuration to form a die stack 120. There may be more than one die stack 120, with alternating stacks stepped in opposite directions. Embodiments may include different numbers of semiconductor die, including for example 1, 2, 4, 8, 16, 32 or 64 die. There may be other numbers of die in further embodiments. The die may be affixed to the substrate and/or each other using a die attach film. As one example, the die attach film may be 8988UV epoxy from Henkel AG & Co. KGaA, cured to a B-stage to preliminarily affix the die 124 in the stack 120, and subsequently cured to a final C-stage to permanently affix the die 124 in the stack 120.

A redistribution layer (RDL) 126 may be affixed to the top of the die stack in step 222. The RDL 126 may be a rigid layer, formed for example of FR4and FR5, or a flexible layer, formed for example of polyimide tape. Referring to FIGS. 5-7, the RDL 126 may have bond pads 134 along an edge of the RDL 126, similar in size and configuration to bond pads 132 provided on the semiconductor die 124. (FIGS. 7 and 9 each show a single semiconductor die 124 in the stack 120 for simplicity, but the semiconductor package 100 shown in FIGS. 7 and 9 may include multiple semiconductor die 124 as in the other illustrated embodiments). Bond pads 134 are shown along a single edge, but bond pads 134 may be provided along two opposed or adjacent edges, along three edges or along all four edges of the RDL 126.

The RDL 126 may further include a pattern of redistribution pads 130 on an upper surface. In embodiments, electrical traces may be provided between the RDL bond pads 134 and the redistribution pads 130 to effectively redistribute the bond pads 134 over the upper surface of the RDL 126. There may be more bond pads 134 than are shown, so that each bond pad 134 may be connected to redistribution pad 130. A passivation layer 136 may be applied over the electrical traces and redistribution pads 130, which passivation layer 136 is then etched or otherwise developed to expose the redistribution pads 130. In step 224, solder balls 140 may be applied to the redistribution pads 130 as shown in FIGS. 6 and 7. The pattern of redistribution pads 130 and solder balls 140 shown in the figures is by way of example, and may vary in further embodiments. Other electrical connectors may be provided instead of solder balls 140, including but not limited to solder paste.

Referring now to views of FIGS. 8 and 9, the respective die 124 in the stack 120 may next be electrically connected to each other the substrate 102 and RDL 126 in step 230 using wire bonds 138. As shown, each semiconductor die 124 may include a row of die bond pads 132 along an edge of the die 124. It is understood that each die 124 may include many more die bond pads 132 than is shown in FIG. 9. Each die bond pad 132 in the row of a semiconductor die may be electrically connected to the corresponding die bond pad 132 in the row of the next adjacent semiconductor die using a wire bond 138. Each die bond pad 132 of the bottom semiconductor die 124 may be electrically connected to the corresponding contact pad 109 in a row of contact pads on substrate 102 using a wire bond 138.

Although wire bonds 138 may be formed by a variety of technologies, in one embodiment, the wire bonds 138 may be formed as ball bonds, though other types of bonds are contemplated. The wire bonds 138 are shown generally in a straight vertical column from one layer to the next in the die stack 120, and to the substrate 102 and RDL 126. However, one or more of the wire bonds may extend diagonally from one layer to the next in alternative embodiments. Further, it may be that a wire bond skips one or more layers in the die stack 120. It is conceivable that the wire bond step 230 be performed before the solder ball bonding step 224 in further embodiments.

Figure 10:
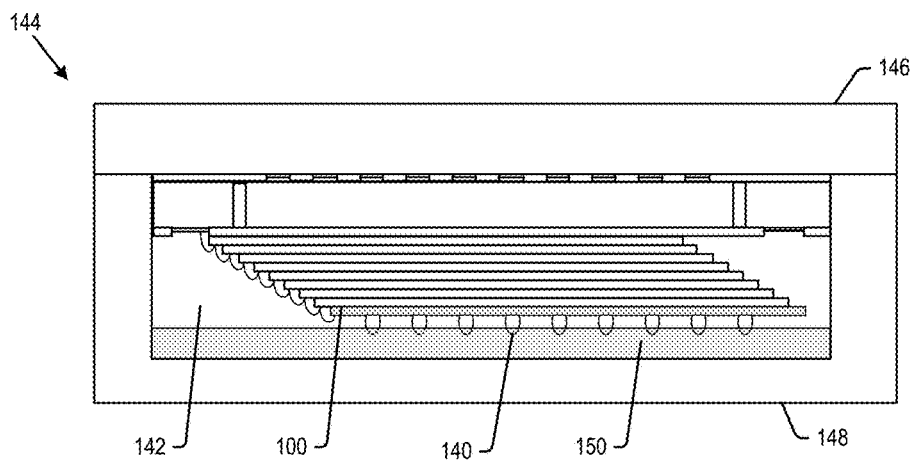
FIG. 10 is a side cross-sectional view of a semiconductor device within a mold chase for encapsulating the semiconductor device.
Figure 11:
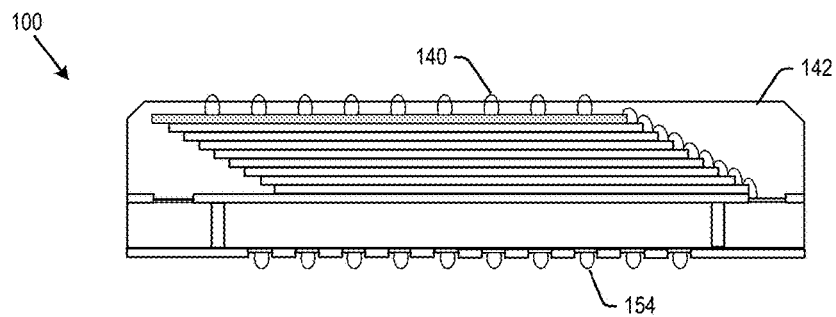
FIG. 11 is a side view of a first completed semiconductor package according to an embodiment of the present technology.

Following electrical connection of the die stack 120 and the formation of solder balls on RDL 126, the semiconductor package 100 may be encapsulated in a mold compound 142 in a step 234 and as shown in FIGS. 10 and 11. The semiconductor device may be placed within a mold chase 144 comprising upper mold plate 146 and lower mold plate 148. Molten mold compound 142 may then be injected into the mold chase 144 to encase the components of the semiconductor package 100 in a protective enclosure in for example a compression molding process. Mold compound 142 may include for example solid epoxy resin, Phenol resin, fused silica, crystalline silica, carbon black and/or metal hydroxide. Such mold compounds are available for example from Sumitomo Corp. and Nitto-Denko Corp., both having headquarters in Japan. Other mold compounds from other manufacturers are contemplated. The mold compound may be applied according to other known processes, including by transfer molding or injection molding techniques.

It is a feature of the present technology that portions of the solder balls 140 of the RDL 126 (also referred to herein as "RDL solder balls 140") remain exposed at an exterior surface of the mold compound 142. Therefore, the lower mold plate 148 may be lined with a release film 150. The tips of the RDL solder balls 140 embed within the release film 150 when the semiconductor package 100 is placed within the mold chase 144. The release film may be for example a polymer which is flexible and to a degree soft, so that, when the package 100 is inserted into the mold chase 144, the tips of the RDL solder balls 140 embed within the release film 150. The release film maintains its structure throughout the encapsulation process, so that the mold compound 142 encases the RDL 126, die 124 and wire bonds 138, but the tips of the RDL solder balls 140 remain exposed through a surface of the mold compound 142, at the completion of the encapsulation process. Upon completion, the release film 150 may be easily removed from the RDL solder balls. One example of a suitable release film 150 is a fluoropolymer, such as for example Fluon® ETFE film, marketed by AGC Chemicals Americas, Inc, having offices in Pennsylvania, USA. Other polymers are possible for release film 150.

In step 236, solder balls 154 (FIG. 11) may be affixed to the contact pads 108 on a lower surface of substrate 102 of the package 100. The solder balls 154 (also referred to herein as "substrate solder balls 154") may be used to affix the semiconductor package 100 to a host device (not shown) such as a printed circuit board. As explained below, the solder balls 154 may alternatively be used to affix the semiconductor package 100 to one or more other semiconductor packages.

As noted above, the semiconductor package 100 may be formed on a panel of substrates. After formation and encapsulation of the packages 100, the packages 100 may be singulated from each other in step 240 to form a finished semiconductor package 100 as shown in FIG. 11. The semiconductor packages 100 may be singulated by any of a variety of cutting methods including sawing, water jet cutting, laser cutting, water guided laser cutting, dry media cutting, and diamond coating wire cutting. While straight line cuts will define generally rectangular or square shaped semiconductor packages 100, it is understood that semiconductor package 100 may have shapes other than rectangular and square in further embodiments of the present technology.

Before, during or after the formation of encapsulated semiconductor package 100, a group of one or more second semiconductor packages 170 may be formed in step 242 and as shown for example in FIGS. 12-18. In embodiments, the group of one or more packages 170 may be flash memory packages formed by the same steps as the package 100, such as for example the above-described steps 200-240 of FIG. 3. However, it is a further feature of the present technology that semiconductor package(s) 170 need not be the same configuration or same type of semiconductor package as package 100. As examples, the group of one or more packages 170 may comprise other types of memory packages, such as SDRAM and other types of RAM. The group of one or more packages 170 may alternatively or additionally comprise controller die, such as an ASIC, or a power semiconductor device such as a switch or rectifier. Other types of semiconductor packages are contemplated as being included within the group of one or more packages 170.

In step 244, the group of one or more second semiconductor packages 170 may be mounted to the first semiconductor package 100. As the semiconductor package 170 has electrical connections on both of its major surfaces (RDL solder balls 140 on the top surface and substrate solder balls 154 on the bottom surface), it is a further feature of the present technology that the group of one or more second semiconductor packages 170 may be affixed above and/or below the package 100. In the following description and as used herein, semiconductor packages including RDL solder balls 140 extending through a surface of the mold compound are referred to as the semiconductor package 100. Packages which do not include RDL solder balls 140 are referred to as one of the semiconductor packages 170.

Figure 12:
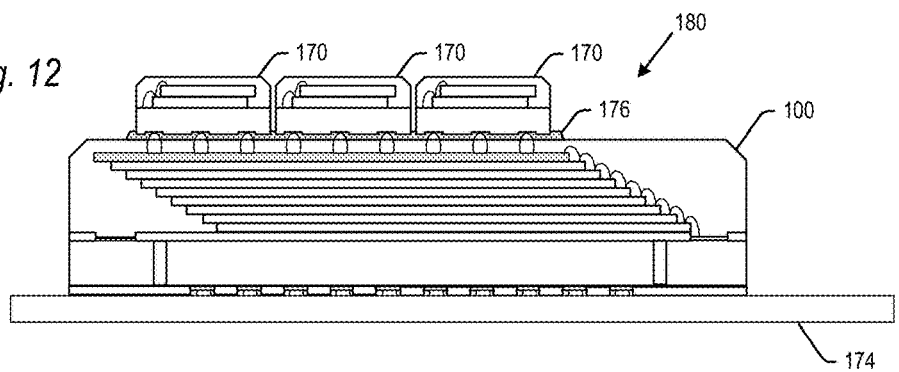
FIGS. 12-18 show the first semiconductor package mounted to a group of one or more second semiconductor packages in a variety of configurations according to example embodiments of the present technology.

FIG. 12 shows a second group of three semiconductor packages 170 physically and electrically connected the semiconductor package 100 by the RDL solder balls 140 to form a semiconductor device 180. In particular, the semiconductor packages 170 may have contact pads on a bottom surface in a pattern that matches the pattern of RDL solder balls 140 with which the contact pads mate and connect, as in a solder reflow step. The semiconductor device 180 is physically and electrically connected to a host device 174, such as for example a printed circuit board (PCB), by the substrate solder balls 154 on the package 100. Thus, signals and voltages are exchanged between the group of semiconductor packages 170 and the host device 174 through the semiconductor package 100.

In embodiments, once affixed to each other, both packages 100 and 170 of device 180 may be encapsulated together in a further encapsulation process. Alternatively, any space between the packages 100 and 170 may be back-filled with an epoxy resin 176. In further embodiments, no further encapsulation or back-fill steps are performed, and the packages 100 and 170 are held together simply by the solder balls 140.

In one example, the semiconductor package 100 in FIG. 12 may include a plurality of non-volatile memory die, such as for example NAND flash memory die. As indicated above, the package 100 may alternatively include one or more semiconductor die and may alternatively be a volatile memory package, a controller, a power semiconductor package or some other type of semiconductor package. In one example, the individual semiconductor packages 170 may include one or more semiconductor die, and may be configured as non-volatile memory packages, volatile memory packages, controllers and/or power semiconductor packages. Other types of semiconductor devices are contemplated for packages 170. The packages 170 may each be of the same type, or may be different types. For example, one of the packages may be a controller, one may be volatile memory and one may be a power semiconductor package. Other combinations are contemplated for packages 170.

In the example shown in FIG. 12, each of the three semiconductor packages 170 are shown mounted to three rows of RDL solder balls 140 on a surface of the semiconductor package 100. This is by way of example only, and the semiconductor packages 170 may be mounted to the package 100 using other numbers of rows of RDL solder balls 140. It is further contemplated that the packages 170 may be different sizes and/or use different numbers of rows of RDL solder balls 140 to affix to package 100. While three packages 170 are shown in the example of FIG. 12, there may be greater or fewer numbers of packages 170 affixed to RDL solder balls 140 of package 100, including for example 1, 2, 4, 5 or 6 packages 170. While all rows of RDL solder balls 140 are shown mounted to a package 170, some of the RDL solder balls 140 may be left without an attachment to a package 170.

As noted above, semiconductor packages 100 may be singulated into individual semiconductor packages, each including a single group of vertically stacked semiconductor die mounted on the substrate 102. However, as shown for example in FIGS. 13 and 14, a single semiconductor package 100 may alternatively be singulated to include multiple groups of vertically stacked semiconductor die on the substrate 102. The semiconductor package 100 of FIGS. 13 and 14 may be fabricated as described above, but singulated to include multiple semiconductor die stacks instead of a single semiconductor die stack.

Figure 13:
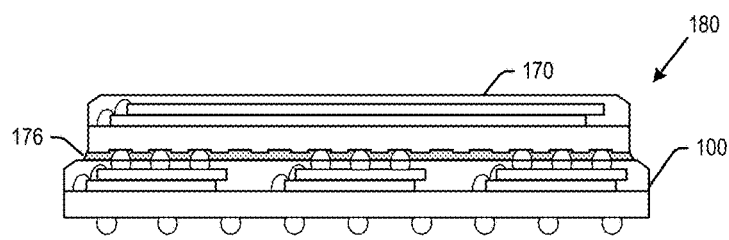
Figure 14:
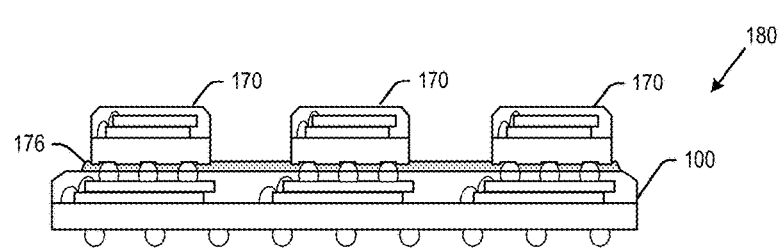

In the embodiment of FIG. 13, a single semiconductor package 170 may be mounted to the RDL solder balls 140 on the separate RDLs 126 of semiconductor package 100 to form a finished semiconductor device 180. In the embodiment of FIG. 14, multiple semiconductor packages 170 may be mounted to the RDL solder balls 140 of the multiple RDLs 126 of semiconductor package 100 to form a finished semiconductor device 180. Each of the packages 100 and 170 in FIGS. 13 and 14 may include a single semiconductor die or multiple semiconductor die (one or more of the packages 100, 170 may have different numbers of semiconductor die). Each of the packages 100 and 170 in FIGS. 13 and 14 may function as a volatile memory, a non-volatile memory, a controller, a power device or have some other functionality (one or more of the packages 100, 170 may have different functionalities).

The embodiments of FIGS. 13 and 14 show three stacks of semiconductor die in the semiconductor package 100, but there may be greater or fewer than three stacks in further embodiments. The embodiment of FIG. 14 shows three semiconductor packages 170 mounted to semiconductor package 100, but there may be greater or fewer than three semiconductor packages 170 in further embodiments, including for example 1, 2, 4, 5 or 6 packages. In the embodiment of FIG. 14, the semiconductor device 180 may function as a single integrated semiconductor device, or it may function as three separate and independent semiconductor devices.

In the embodiments of FIGS. 13 and 14, once affixed to each other, the packages 100 and 170 of device 180 may be encapsulated together in a further encapsulation process. Alternatively, any space between the packages 100 and 170 may be back-filled with an epoxy resin 176. In further embodiments, no further encapsulation or back-fill steps are performed, and the packages 100 and 170 are held together simply by the solder balls 140. The semiconductor devices 180 of FIGS. 13 and 14 may be mounted to a host device (not shown) such as a PCB by substrate solder balls 154 of package 100.

Figure 15:
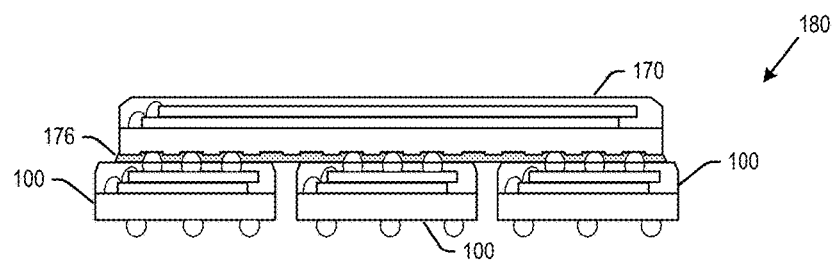

FIG. 15 shows a further embodiment where a single semiconductor package 170 is mounted to the RDL solder balls 140 of three separate and independent semiconductor packages 100. FIG. 15 may include the same components and features of the embodiment shown in FIG. 13, with the exception that the individual semiconductor die stacks and FIG. 15 are singulated to be separate semiconductor packages.

The embodiments described above with respect to FIGS. 12-14 comprise semiconductor devices 180 including two stacked and vertically integrated levels of semiconductor packages. Further embodiments of the present technology may comprise semiconductor devices including more than two stacked and vertically integrated levels of semiconductor packages. For example, FIGS. 16 and 17 each show three vertically integrated levels of semiconductor packages. A bottom level may comprise one or more semiconductor packages 100 mounted to a host device (not shown) by substrate solder balls 154. A second level may comprise one or more semiconductor packages 100 mounted to the RDL solder balls 140 of the bottom level semiconductor package(s) 100. Note that in such a configuration, the substrate solder balls 154 may be omitted from the second level semiconductor package(s) 100, so that the RDL solder balls 140 of the bottom level are soldered to contact pads 108 on the substrate(s) 102 of the second level semiconductor package(s) 100. A third level may comprise one or more semiconductor packages 170 mounted to the RDL solder balls 140 of the second level semiconductor package(s) 100.

Figure 16:
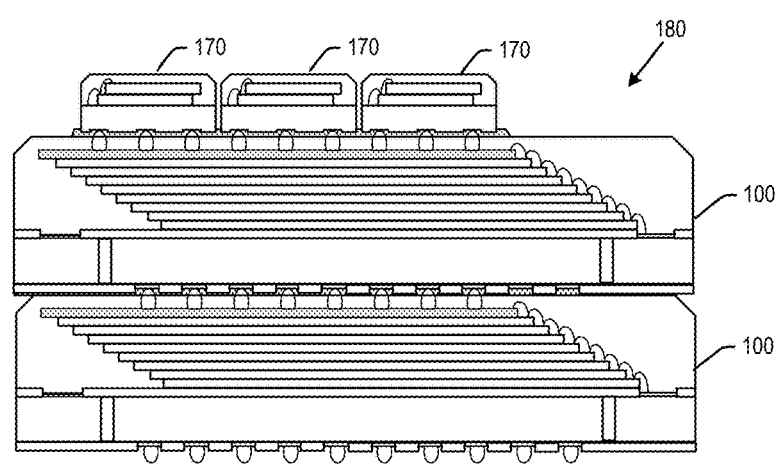
Figure 17:
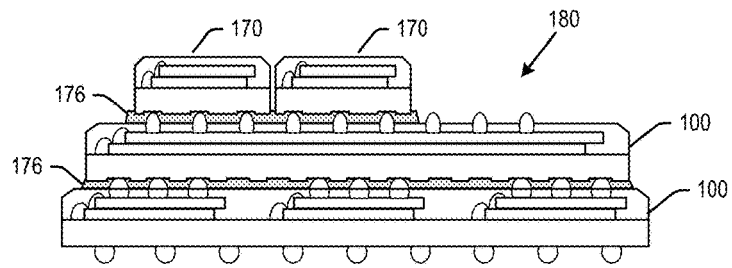

While FIGS. 16 and 17 show specific examples of semiconductor devices 180 including three levels of semiconductor packages, it is understood that semiconductor devices 180 of FIGS. 16 and 17 we have a variety of other configurations. Each level may include one or more semiconductor packages, and each semiconductor package may include one or more semiconductor die. Where a semiconductor package on a given level includes multiple semiconductor die, though semiconductor die may be provided in a single vertical stack or multiple side-by-side vertical stacks. Each of the packages 100 and 170 in FIGS. 16 and 17 may function as a volatile memory, a non-volatile memory, a controller, a power device or have some other functionality (one or more of the packages 100, 170 may have different functionalities).

In the embodiments of FIGS. 16 and 17, once affixed to each other, the packages 100 and 170 of device 180 may be encapsulated together in a further encapsulation process. Alternatively, any space between the packages 100 and 170 may be back-filled with an epoxy resin 176, two separate layers in this embodiment. In further embodiments, no further encapsulation or back-fill steps are performed, and the packages 100 and 170 are held together simply by the solder balls 140 in the two packages 100. The semiconductor devices 180 of FIGS. 16 and 17 may be mounted to a host device (not shown) such as a PCB by substrate solder balls 154 of the bottom package 100. While three levels of vertically integrated semiconductor packages 100, 170 are shown in FIGS. 16 and 17, there may be more than three levels of vertically integrated semiconductor packages 100, 170 in further embodiments.

Figure 18:
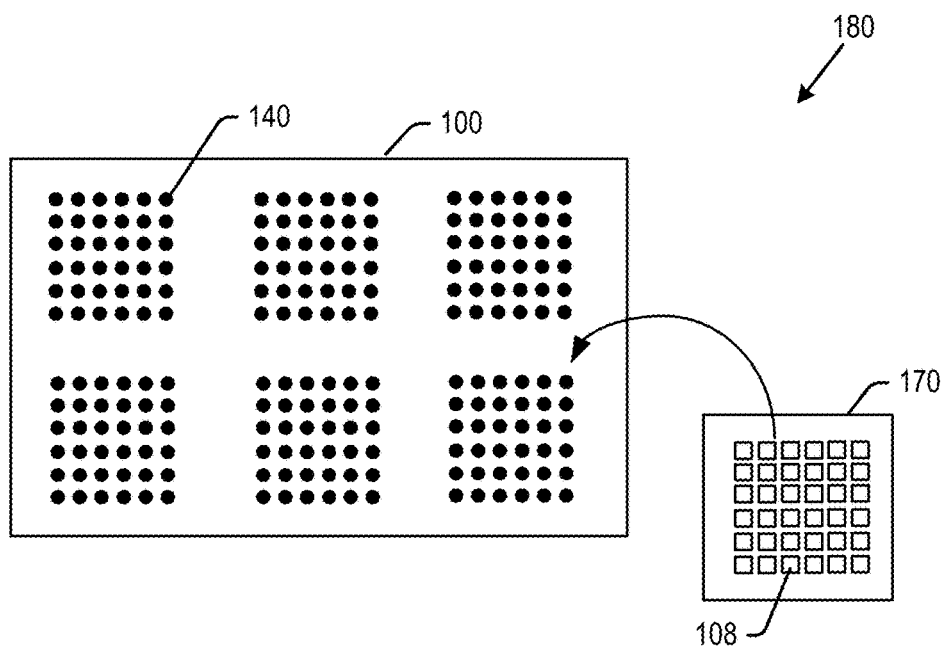

The pattern of RDL solder balls 140 in semiconductor package 100, including number, arrangement and spacing, may be provided in coordination with the number of second level packages 170 and the pattern of substrate contact pads 108 in those second level packages 170. For example, FIG. 18 shows a top surface of a semiconductor package 100 including a pattern of RDL solder balls 140. The RDL solder balls 140 in this example are arranged in six groups, to receive six distinct second level semiconductor packages 170 (one of which is shown in bottom view). As shown, each group has a pattern of RDL solder balls 140 that is coordinated with the pattern of substrate contact pads 108 of the packages 170 to be mounted on the package 100. In particular, the number, arrangement and spacing of the RDL solder balls 140 may be configured to match the number, arrangement and spacing of the substrate contact pads 108. The substrate contact pads 108 in the other packages 170 (not shown) in the example of FIG. 18 may have the same pattern of as the group of substrate contact pads 108 shown.

During and after completion of the respective packages 100 and 170 (but before being affixed to each other), each of the packages 100 and 170 may be tested for operation and quality. It is a feature of the present technology to provide a higher yield of semiconductor devices. For example, where a variety of semiconductor die such as non-volatile memory, volatile memory and a controller are packaged together, a defect may require discarding the entire package. However, by assembling and testing individual components into packages, and then integrating those packages together, the likelihood of having to discard an entire semiconductor device is minimized.

Additionally, defects in fabricated semiconductor packages are often not fatal, but result in finished semiconductor packages of varying quality. Finished semiconductor packages may be tested in a "binning" process, and categorized based on their performance. It is a further feature of the present technology that binning allows semiconductor packages of like quality to be affixed to each other. This allows for higher overall quality of the produced semiconductor devices 180 as compared to devices including a single package having the same number of semiconductor die.

In summary, in one example, the present technology relates to a semiconductor device, comprising: a first semiconductor package, comprising: a first substrate, a first group of one or more semiconductor die, a redistribution layer having a plurality of solder balls affixed to a surface of the redistribution layer, and a first mold compound encapsulating at least a portion of the first semiconductor package, at least a portion of the solder balls extending through a surface of the first mold compound; and a group of one or more second semiconductor packages, comprising: at least one second substrate comprising contact pads on at least one surface of the at least one second substrate, a second group of one or more semiconductor die, and at least one second mold compound encapsulating at least a portion of the at least one second semiconductor package; a pattern of the solder balls extending through the surface of the first mold compound matching a pattern of the contact pads on the at least one surface of the at least one second substrate, the solder balls being affixed to the contact pads to couple the first semiconductor package to the group of one or more second semiconductor packages.

In another example, the present technology relates to a semiconductor device, comprising: a first group of one or more first semiconductor packages, comprising: at least a first substrate, a first group of one or more first semiconductor die, a redistribution layer having a plurality of solder balls affixed to a surface of the redistribution layer, and a first mold compound encapsulating at least a portion of the first group of one or more first semiconductor packages, the solder balls being exposed through a surface of the first mold compound; and a second group of one or more second semiconductor packages, comprising: at least one second substrate comprising contact pads on at least one surface of the at least one second substrate, a second group of one or more second semiconductor die, and at least one second mold compound encapsulating at least a portion of the second group of one or more second semiconductor packages; a pattern of the solder balls of redistribution layer matching a pattern of the contact pads on the at least second substrate, the solder balls being affixed to the contact pads to couple the first group of one or more first semiconductor packages to the second group of one or more second semiconductor packages.

In a further example, the present technology relates to a semiconductor device, comprising: a first group of one or more first semiconductor packages, comprising: at least a first substrate means for transferring signals to and from semiconductor die, a first group of one or more first semiconductor die mounted on the substrate means, redistribution means for electrically connecting a plurality of contact pads on the redistribution means to a plurality of soldering means affixed to a surface of the redistribution means, and first encapsulation means for encapsulating at least a portion of the first group of one or more first semiconductor packages, the soldering means being exposed through a surface of the first encapsulation means; and a second group of one or more second semiconductor packages, comprising: at least one second substrate means for transferring signals to and from semiconductor die, the at least one second substrate means comprising electrical connector means on at least one surface of the at least one second substrate, a second group of one or more second semiconductor die, and second encapsulation means encapsulating at least a portion of the second group of one or more second semiconductor packages; a pattern of the soldering means of the redistribution means matching a pattern of the electrical connector means on the at least second substrate, the soldering means being affixed to the electrical connector means to couple the first group of one or more first semiconductor packages to the second group of one or more second semiconductor packages.

In another example, the present technology relates to a semiconductor device, comprising: at least one first semiconductor package, including: a first substrate including a first plurality of interconnect features, wherein the first plurality of interconnect features creates a first pattern; at least one first group of semiconductor die electrically connected to the first plurality of interconnect features; a first layer connected to the first group of semiconductor dies, the first layer having a second plurality of interconnect features affixed to a surface of the first layer, wherein the second plurality of interconnect features are electrically connected to the first group of semiconductor die, further wherein the second plurality of interconnect features creates a second pattern; and an encapsulation layer positioned around the first semiconductor package, wherein the first plurality of interconnect features are exposed through a surface of the first encapsulation layer; at least one second semiconductor package, including: a second substrate comprising a plurality of contact pads on a first surface of the second substrate, wherein the plurality of contact pads creates a third pattern; at least one second group semiconductor die; and a second encapsulation later positioned around the at least one second semiconductor package; wherein, at least one of the pattern of the first and second plurality of interconnect features matches the third pattern of the plurality of contact pads such that the first or second plurality of interconnect feature are able to be electrically connected to the plurality of contact pads.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:

1. A semiconductor device, comprising:
    a first semiconductor package, comprising:
        a first substrate,
        a first group of one or more semiconductor die,
        a redistribution layer having a plurality of solder balls affixed to a surface of the redistribution layer, and
        a first mold compound encapsulating at least a portion of the first semiconductor package, at least a portion of the solder balls extending through a surface of the first mold compound; and
    a group of one or more second semiconductor packages, comprising:
        at least one second substrate comprising contact pads on at least one surface of the at least one second substrate,
        a second group of one or more semiconductor die,
        at least one second mold compound encapsulating at least a portion of the at least one second semiconductor package; and
        a pattern of the solder balls extending through the surface of the first mold compound matching a pattern of the contact pads on the at least one surface of the at least one second substrate, the solder balls being affixed to the contact pads to couple the first semiconductor package to the group of one or more second semiconductor packages;
    wherein the solder balls extend through the surface of the first mold compound by the solder balls embedding in a release film in a mold chase used to form the first mold compound, and removing the release film after the first mold compound is formed.

2. The semiconductor device of claim 1, wherein signals communicated between the group of one or more second semiconductor packages and a host device occur through the first semiconductor package.

3. The semiconductor device of claim 1, wherein a functionality of the first package is different than a functionality of the group of one or more second semiconductor packages.

4. The semiconductor device of claim 1, wherein the group of one or more second semiconductor packages comprise a plurality of semiconductor packages mounted to a surface of the first semiconductor package.

5. The semiconductor device of claim 4, wherein two or more packages of the plurality of second semiconductor packages have the same functionality.

6. The semiconductor device of claim 4, wherein two or more packages of the plurality of second semiconductor packages have different functionalities than each other.

7. The semiconductor device of claim 1, wherein the group of one or more semiconductor die in the first semiconductor package comprises a plurality of semiconductor die stacked in a single stack on the first substrate.

8. The semiconductor device of claim 1, wherein the group of one or more semiconductor die in the first semiconductor package comprises a plurality of semiconductor die stacked in plurality of stacks on the first substrate.

9. A semiconductor device, comprising:
    a first group of one or more first semiconductor packages, comprising:
        at least a first substrate,
        a first group of two or more first semiconductor die,
        a redistribution layer having a plurality of solder balls affixed to a surface of the redistribution layer on each of the two or more first semiconductor die of the first group of two or more semiconductor die, and
        a first mold compound encapsulating at least a portion of the first group of one or more first semiconductor packages, the solder balls being exposed through a surface of the first mold compound; and
    a second semiconductor package, comprising:
        a second substrate comprising contact pads on at least one surface of the second substrate,
        a second group of one or more second semiconductor die,
        a second mold compound encapsulating at least a portion of the second semiconductor package; and
        a pattern of the solder balls of redistribution layers on the two or more first semiconductor dies together matching a pattern of the contact pads on the second substrate, the solder balls being affixed to the contact pads to couple the first group of one or more first semiconductor packages to the second semiconductor package.

10. The semiconductor device of claim 9, wherein the first group of one or more first semiconductor packages comprise a plurality of first semiconductor packages.

11. The semiconductor device of claim 10, wherein two or more packages of the plurality of first semiconductor packages have the same functionality.

12. The semiconductor device of claim 10, wherein two or more packages of the plurality of first semiconductor packages have different functionality than each other.

13. The semiconductor device of claim 9, wherein the first group of one or more first semiconductor packages comprise a single semiconductor package.

14. A semiconductor device, comprising:
 a first semiconductor package, comprising:
  a first substrate,
  a first group of one or more semiconductor die,
  a redistribution layer having a plurality of solder balls affixed to a surface of the redistribution layer, and
  a first mold compound encapsulating at least a portion of the first semiconductor package, at least a portion of the solder balls extending through a surface of the first mold compound; and
 a group of two or more second semiconductor packages mounted on a surface of the first semiconductor package, each of the two or more second semiconductor packages comprising:
  a second substrate comprising contact pads on a surface of the second substrate,
  a second group of one or more semiconductor die,
  a second mold compound encapsulating each of the two or more second semiconductor packages; and
 a pattern of the solder balls extending through the surface of the first mold compound matching a pattern of the contact pads on the surfaces of each of the second substrates together, the solder balls being affixed to the contact pads to couple the first semiconductor package to the group of two or more second semiconductor packages.

15. The semiconductor device of claim 14, wherein a functionality of the first package is different than a functionality of at least one of the group of two or more second semiconductor packages.

16. The semiconductor device of claim 14, wherein two or more packages of the group of two or more second semiconductor packages have the same functionality.

17. The semiconductor device of claim 14, wherein two or more packages of the group of two or more second semiconductor packages have different functionalities than each other.

* * * * *